(12) United States Patent
Abe et al.

(10) Patent No.: US 10,608,183 B2
(45) Date of Patent: Mar. 31, 2020

(54) CHARGE TRANSPORT LAYER AND ORGANIC PHOTOELECTRONIC ELEMENT

(71) Applicants: AGC Inc., Chiyoda-ku (JP); National University Corporation Yamagata University, Yamagata-shi (JP)

(72) Inventors: Takefumi Abe, Chiyoda-ku (JP); Yasuhiro Kuwana, Chiyoda-ku (JP); Shigeki Hattori, Chiyoda-ku (JP); Kaori Tsuruoka, Chiyoda-ku (JP); Daisuke Yokoyama, Yonezawa (JP)

(73) Assignees: AGC Inc., Chiyoda-ku (JP); National University Corporation Yamagata University, Yamagata-shi (JP)

(*) Notice: Subject to any disclaimer, the term of this patent is extended or adjusted under 35 U.S.C. 154(b) by 0 days.

(21) Appl. No.: 16/431,176

(22) Filed: Jun. 4, 2019

(65) Prior Publication Data
US 2019/0288205 A1    Sep. 19, 2019

Related U.S. Application Data

(63) Continuation of application No. PCT/JP2017/044772, filed on Dec. 13, 2017.

(30) Foreign Application Priority Data

Dec. 14, 2016    (JP) ................................ 2016-242466
Aug. 24, 2017    (JP) ................................ 2017-161644

(51) Int. Cl.
| | | |
|---|---|---|
| *H01L 51/00* | (2006.01) | |
| *C08F 14/18* | (2006.01) | |
| *C09D 127/24* | (2006.01) | |
| *H01L 51/52* | (2006.01) | |
| *H05B 33/10* | (2006.01) | |
| *G09F 9/30* | (2006.01) | |
| *H01L 51/50* | (2006.01) | |

(52) U.S. Cl.
CPC .......... *H01L 51/004* (2013.01); *C08F 14/185* (2013.01); *C09D 127/24* (2013.01);
(Continued)

(58) Field of Classification Search
CPC ... H01L 51/004; H01L 51/50; H01L 51/5275; C08F 14/185; C09D 127/24; G09F 9/30; H05B 33/10
See application file for complete search history.

(56) References Cited

U.S. PATENT DOCUMENTS

2003/0222250 A1    12/2003    Hsu
2007/0207341 A1    9/2007    Iida et al.
(Continued)

FOREIGN PATENT DOCUMENTS

JP    2005-519440    6/2005
JP    2006-237083    9/2006
(Continued)

OTHER PUBLICATIONS

International Search Report dated Mar. 20, 2018 in PCT/JP2017/044772 filed Dec. 13, 2017 (with English Translation).

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

To provide a charge transport layer excellent in the external quantum efficiency, and an organic photoelectronic element comprising the charge transport layer.
A charge transport layer comprising a film containing a fluorinated polymer and a semiconductor material, wherein the film has a material composition such that $\Delta E_{th}$ is within a range of from 0.010 to 0.080 MV/cm. An organic photoelectronic element comprising the charge transport layer.

12 Claims, 2 Drawing Sheets

(52) U.S. Cl.
 CPC ............... *G09F 9/30* (2013.01); *H01L 51/50*
 (2013.01); *H01L 51/5275* (2013.01); *H05B*
 *33/10* (2013.01); *H01L 51/5056* (2013.01);
 *H01L 51/5088* (2013.01); *H01L 51/5206*
 (2013.01); *H01L 51/5221* (2013.01); *H01L*
 *2251/301* (2013.01); *H01L 2251/308*
 (2013.01); *H01L 2251/558* (2013.01)

(56) References Cited

U.S. PATENT DOCUMENTS

| | | | |
|---|---|---|---|
| 2008/0079357 A1 | 4/2008 | Ishii et al. | |
| 2012/0052426 A1* | 3/2012 | Qi ..................... | G03G 5/0514 |
| | | | 430/58.5 |
| 2012/0056168 A1 | 3/2012 | Ie et al. | |
| 2013/0037753 A1 | 2/2013 | Ishitsuka et al. | |
| 2017/0104161 A1* | 4/2017 | Otani ..................... | H01L 51/50 |

FOREIGN PATENT DOCUMENTS

| | | |
|---|---|---|
| JP | 2008-91175 | 4/2008 |
| JP | 2010-209264 | 9/2010 |
| JP | 2010-280907 | 12/2010 |
| WO | WO 2011/132702 A1 | 10/2011 |
| WO | WO 2013/108618 A1 | 7/2013 |
| WO | WO 2015/186688 A1 | 12/2015 |
| WO | WO 2016/204275 A1 | 12/2016 |

* cited by examiner

US 10,608,183 B2

CHARGE TRANSPORT LAYER AND ORGANIC PHOTOELECTRONIC ELEMENT

TECHNICAL FIELD

The present invention relates to a charge transport layer and an organic photoelectronic element.

BACKGROUND ART

In recent years, the internal quantum efficiency of an organic electroluminescence element (organic EL element) reaches almost 100%. On the other hand, the light-extraction efficiency relating to the external quantum efficiency remains at a level of from about 20 to about 30% and is required to be improved. As one reason why the light-extraction efficiency decreases is that part of light generated in an emissive layer located between two electrodes is lost in the element by reflection in the element, the surface plasmon, the guided waves, etc.

Patent Document 1 discloses a technique such that nano-sized porous silica particles are incorporated in a charge transport layer to lower the refractive index of the charge transport layer thereby to improve the light-extraction efficiency.

PRIOR ART DOCUMENT

Patent Document

Patent Document 1: WO2013/108618

DISCLOSURE OF INVENTION

Technical Problem

However, in recent years, a further improvement in the light-extraction efficiency is required.

The present invention provides a charge transport layer excellent in the external quantum efficiency, and an organic photoelectronic element comprising such a charge transport layer.

Solution to Problem

[1] A charge transport layer comprising a film containing a fluorinated polymer and a semiconductor material,
wherein the film has a material composition such that $\Delta E_{th}$ is within a range of from 0.010 to 0.080 MV/cm,
wherein $\Delta E_{th}$ is a value calculated from the formula ($\Delta E_{th} = E_{th}(A) - E_{th}(B)$),
$E_{th}(A)$ is a threshold electric filed when a measurement film is formed only by the semiconductor material in the following HOD;
$E_{th}(B)$ is a threshold electric filed when a measurement film is formed only by the film in the following HOD;
the threshold electric filed is a value of an electric field when a current flows at a current density of 0.0001 time a current density Js (unit: mA/cm$^2$) at which a current flows when an electric field of 0.8 MV/cm is applied to between an ITO electrode and an Al electrode as a standard, in the following HOD; and
HOD is a hole only device comprising only the following layer structure: glass substrate/ITO electrode (100 nm thickness)/MoO$_3$ (5 nm thickness)/measurement film (100 nm thickness)/Al electrode (100 nm thickness).

[2] The charge transport layer according to [1], wherein the film has a fluorination rate ($R_{F-mix}$) of from 5 to 45%, wherein the fluorination rate ($R_{F-mix}$) is a product represented by the formula ($R_{F-mix} = R_{F-P} \times R_P$),
$R_{F-P}$ in the formula is a fluorine atom content (mass %) of the fluorinated polymer contained in the film, and
$R_P$ in the formula is a fluorinated polymer content (vol %) in the film.

[3] The charge transport layer according to [2], wherein the fluorinated polymer has a fluorine atom content ($R_{F-P}$) of from 20 to 77 mass %.

[4] The charge transport layer according to [2] or [3], wherein the film has a fluorinated polymer content ($R_P$) of from 20 to 65 vol %.

[5] The charge transport layer according to any one of [1] to [4], wherein the fluorinated polymer has a refractive index in a wavelength range of from 450 to 800 nm of at most 1.5.

[6] The charge transport layer according to any one of [1] to [5], wherein the fluorinated polymer is a perfluoropolymer.

[7] The charge transport layer according to [6], wherein the perfluoropolymer is a perfluoropolymer having units formed by cyclopolymerization of a cyclopolymerizable perfluorodiene.

[8] The charge transport layer according to [7], wherein the perfluorodiene is perfluoro(3-butenyl vinyl ether).

[9] An organic photoelectronic element comprising the charge transport layer as defined in any one of [1] to [8].

[10] The organic photoelectronic element according to [9], wherein the photoelectronic element is an organic EL element.

[11] The organic photoelectronic element according to [10], wherein the organic EL element comprises an anode, a cathode provided to face the anode, an emissive layer provided between the anode and the cathode, and the charge transport layer provided on the emissive layer side of the anode.

[12] The organic photoelectronic element according to [10] or [11], wherein the organic EL element comprises an anode, a cathode provided to face the anode, an emissive layer provided between the anode and the cathode, a hole injection layer provided on the emissive layer side of the anode, and a hole transport layer provided on the emissive layer side of the hole injection layer, and at least one of the hole injection layer and the hole transport layer is the charge transport layer.

Advantageous Effects of Invention

The charge transport layer of the present invention exhibits excellent external quantum efficiency when provided in an organic photoelectronic element.

The organic photoelectronic element of the present invention, which comprises the charge transport layer of the present invention between an electrode and an emissive layer, exhibits excellent external quantum efficiency.

DESCRIPTION OF EMBODIMENTS

Figure 1:
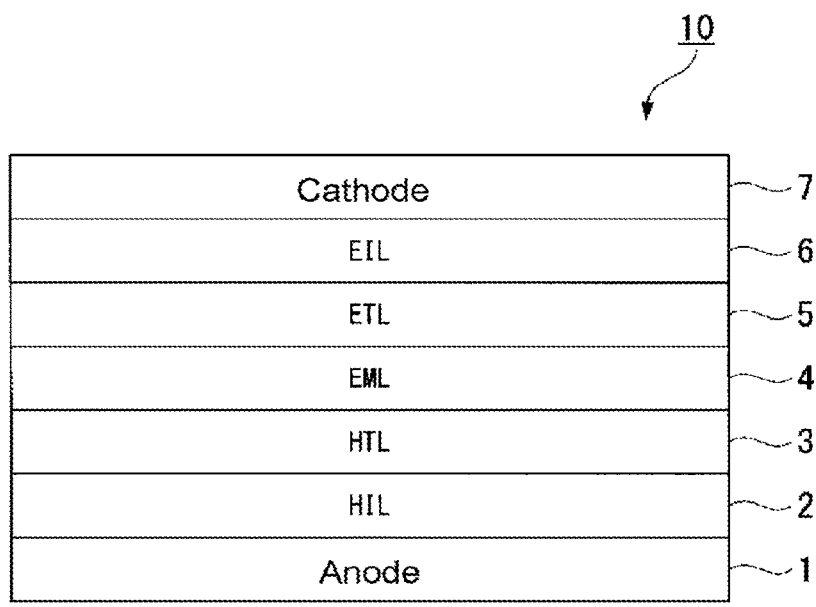
FIG. 1 is a view schematically illustrating an example of a layer structure of the organic photoelectronic element of the present invention.

In the present invention, a "hole only device" means an element which is one type of single carrier device and in which holes from an anode flow but electrons from a cathode do not flow. In this specification, it will be abbreviated as "HOD".

In the present invention, the "absorption coefficient (unit: $cm^{-1}$)" means a value measured in accordance with JIS K0115.

[Charge Transport Layer]

The charge transport layer of the present invention is useful as a charge transport layer which transports holes from an electrode to an emissive layer in an organic photoelectronic element.

The charge transport layer of the present invention is a layer located between the electrode and the emissive layer, and may be in contact with either one or both of the electrode and the emissive layer, or may be in contact with a layer other than the electrode and the emissive layer.

In a case where the charge transport layer of the present invention is in contact with an electrode, such a charge transport layer may be considered as a charge injection layer which injects charges from the electrode to the emissive layer side.

In a case where the charge transport layer of the present invention constitutes the charge injection layer in the organic photoelectronic element, the organic photoelectronic element may have a charge transport layer other than the charge injection layer. In such a case, the charge transport layer may be the charge transport layer of the present invention or may be a charge transport layer other than the layer of the present invention.

The charge transport layer of the present invention is a charge transport layer comprising a film containing a fluorinated polymer and a semiconductor material (hereinafter sometimes referred to as "mixed film"), and the mixed film has a material composition such that $\Delta E_{th}$ is within a range of from 0.010 to 0.080 MV/cm, wherein $\Delta E_{th}$ is a value calculated from the formula ($\Delta E_{th} = E_{th}(A) - E_{th}(B)$), $E_{th}(A)$ is a threshold electric filed when a measurement film is formed only by the semiconductor material in the following HOD;

$E_{th}(B)$ is a threshold electric filed when a measurement film is formed only by the mixed film in the following HOD;

the threshold electric filed is a value of an electric field when a current flows at a current density of 0.0001 time a current density Js (unit: $mA/cm^2$) at which a current flows when an electric field of 0.8 MV/cm is applied to between an ITO electrode and an Al electrode as a standard, in the following HOD; and HOD is a hole only device comprising only the following layer structure: glass substrate/ITO electrode (100 nm thickness)/$MoO_3$ (5 nm thickness)/measurement film (100 nm thickness)/Al electrode (100 nm thickness). A power source which applies an electric field to the HOD is not included in the HOD.

$\Delta E_{th}$ is preferably from 0.015 to 0.075 MV/cm, more preferably from 0.020 to 0.070 MV/cm, further preferably from 0.025 to 0.065 MV/cm.

Within the above range, the external quantum efficiency of the organic photoluminescence element of the present invention comprising the charge transport layer of the present invention will more easily be improved.

To adjust the material composition of the mixed film so that $\Delta E_{th}$ is within the above range, for example, a method of adjusting the fluorination rate ($R_{F\text{-}mix}$) of the mixed film may be mentioned. The fluorination rate ($R_{F\text{-}mix}$) is a product represented by the formula ($R_{F\text{-}mix} = R_{F\text{-}P} \times R_P$).

In the above formula, $R_{F\text{-}P}$ is a fluorine atom content (mass %) of the fluorinated polymer contained in the mixed film, and $R_P$ is a content (vol %) of the fluorinated polymer in the mixed film.

The fluorine atom content ($R_{F\text{-}P}$) is calculated by the after-described formula. The content ($R_P$) of the fluorinated polymer is obtained from the amount of charge of materials in the mixed film or by chemical analysis (for example, NMR or elemental analysis).

In a case where the mixed film contains more than one fluorinated polymer, the fluorination rate ($R_{F\text{-}mix}$) is a sum of the fluorination rates calculated from the respective fluorinated polymers.

The fluorine atom content ($R_{F\text{-}P}$) (mass %) of the fluorinated polymer is obtained from the following formula.

(Fluorine atom content ($R_{F\text{-}P}$))=[19×$N_F$/$M_A$]×100

$N_F$: The sum of values each obtained by multiplying the number of fluorine atoms in each type of units constituting the fluorinated polymer (A) and the mole fraction of the units to all the units.

$M_A$: The sum of values each obtained by multiplying the total of atomic weights of all atoms constituting each type of units constituting the fluorinated polymer (A) and the mole fraction of the units to all the units.

The fluorine atom content ($R_{F\text{-}P}$) of the fluorinated polymer is a value measured by $^1$H-NMR or elemental analysis. The fluorine atom content ($R_{F\text{-}P}$) of the fluorinated polymer may be calculated also from the amounts of charge of monomers and an initiator used for producing the fluorinated polymer (A).

The fluorination rate ($R_{F\text{-}mix}$) of the mixed film is preferably from 5 to 45%, more preferably from 10 to 40%, further preferably from 15 to 35%.

When the fluorination rate ($R_{F\text{-}mix}$) is within the above range, the material composition of the mixed film can easily be adjusted so that $\Delta E_{th}$ is within the above range.

The fluorine atom content ($R_{F\text{-}P}$) of the fluorinated polymer is preferably from 20 to 77 mass %, more preferably from 30 to 70 mass %, further preferably from 40 to 70 mass %.

When the fluorine atom content ($R_{F\text{-}P}$) is within the above range, the material composition of the mixed film can easily be adjusted so that $\Delta E_{th}$ is within the above range.

The content ($R_P$) of the fluorinated polymer in the mixed film is preferably from 20 to 65 vol %, more preferably from 30 to 60 vol %, further preferably from 40 to 55 vol %.

When the content ($R_P$) of the fluorinated polymer is within the above range, the material composition of the mixed film can easily be adjusted so that $\Delta E_{th}$ is within the above range.

The meaning of $R_{F\text{-}mix}$ is estimated as follows although qualitatively. $R_{F\text{-}P}$ is mass % of fluorine atoms in the fluorinated polymer in the mixed film, and is considered to represent "conductivity-assisting capacity" of the fluorinated polymer. $R_{F\text{-}mix}$ is considered to quantitatively represent "conductivity-assisting capacity" per volume of the charge transport layer, by multiplying $R_{F\text{-}mix}$ by $R_P$ which is a volume ratio. Here, the "conductivity-assisting capacity" is a function to satisfy both acceleration of charge injection at the interface and maintenance of conductive paths in the film, and is considered to partly result from electronegativity of fluorine atoms, but its mechanism in detail is still unknown.

Now, the materials of the charge transport layer of the present invention will be described below.

(Fluorinated Polymer)

The fluorinated polymer contained in the charge transport layer of the present invention is a polymer containing fluorine atoms. In the present invention, an oligomer is included in a polymer. That is, the fluorinated polymer may be an oligomer. From the viewpoint of the rate of formation of a layer such as a charge transport layer, and the strength and the surface roughness of the layer, the fluorinated polymer preferably has a saturated vapor pressure sufficient to be practically used at a temperature at which the heat decomposition of the fluorinated polymer occurs or lower. The thermal decomposition starting temperature of PTFE which is a common fluorinated polymer is about 400° C., and the heat decomposition starting temperature of Teflon (registered trademark) AF is 350° C. The saturated vapor pressure of the fluorinated polymer at 300° C. is at least 0.001 Pa, preferably at least 0.002 Pa. From such a viewpoint, the fluorinated polymer is preferably one having an alicyclic structure in its main chain, which is considered to have low crystallinity. Further, more preferred is a perfluoropolymer, which is considered to have small intermolecular interaction of the polymer.

"Having an alicyclic structure in its main chain" means a fluorinated polymer having units having an alicyclic structure, at least one carbon atoms constituting the alicyclic ring being a carbon atom constituting the main chain. The alicyclic ring may be a ring having a hetero atom such as an oxygen atom. Further, the "main chain" means, in the case of a polymer of a monoene having a polymerizable carbon-carbon double bond, a chain of carbon atoms derived from the two carbon atoms constituting the carbon-carbon double bond, and in the case of a polymer formed by cyclopolymerization of a cyclopolymerizable diene, a chain of carbon atoms derived from the four carbon atoms constituting the two carbon-carbon double bonds. In a copolymer of the monoene and the cyclopolymerizable diene, the main chain is constituted by the two carbon atoms of the monoene and the four carbon atoms of the diene.

In this specification, the saturated vapor pressure (unit: Pa) is a value measured by vacuum thermovalance (manufactured by ADVANCE RIKO, Inc., VAP-9000).

The weight average molecular weight (Mw) of the fluorinated polymer is preferably from 1,500 to 50,000, more preferably from 3,000 to 40,000, further preferably from 5,000 to 30,000. When the weight average molecular weight is at least 1,500, a layer formed from such a fluorinated polymer tends to have sufficient strength. On the other hand, when the weight average molecular weight is at most 50,000, such a fluorinated polymer has a saturated vapor pressure which imparts practical layer forming rate (film deposition rate), and accordingly it is not necessary to heat the deposition source to high temperature, specifically a temperature higher than 400° C. If the temperature of the deposition source is too high, the main chain of the fluorinated polymer will cleave in the deposition step, the fluorinated polymer tends to have a low molecular weight, and the layer to be formed tends to have insufficient strength and further defects derived from decomposed products will form, whereby a smooth surface is hardly obtained. Further, unintentionally included molecules or ions formed by cleavage of the main chain may influence the electrical conductivity of the film, and in such a case, it may be difficult to control the electrical conductivity of the layer.

Accordingly, when Mw is within a range of from 1,500 to 50,000, a layer having sufficient strength and a smooth surface will be formed without cleavage of the main chain of the fluorinated polymer.

From the viewpoint of the stability of the quality of the layer to be formed, the dispersity (molecular weight distribution) (Mw/Mn) of the fluorinated polymer is preferably low, and is preferably at most 2. The theoretical lower limit of the dispersity is 1. In order to obtain a fluorinated polymer having a low dispersity, a method of conducting controlled polymerization such as living radical polymerization, a molecular weight fractionation purification method by size exclusion chromatography or a molecular weight fractionation purification method by sublimation purification may be mentioned. Among these methods, considering the stability of the deposition rate in the case of employing a deposition method for formation of the layer, sublimation purification is preferred.

In this specification, the weight average molecular weight and dispersity are values measured by gel permeation chromatography (GPC).

The glass transition point (Tg) of the fluorinated polymer is preferably high, whereby the reliability of the obtainable element will be high. Specifically, the glass transition point is preferably at least 60° C., more preferably at least 80° C., particularly preferably at least 100° C. The upper limit is not particularly limited and is preferably 350° C., more preferably 300° C.

In a case where the perfluoropolymer having a fluorinated alicyclic structure in its main chain is a perfluoropolymer consisting solely of units obtained by cyclopolymerization of perfluoro(3-butenyl vinyl ether), it has an intrinsic viscosity [η] of preferably from 0.01 to 0.14 dl/g, more preferably from 0.02 to 0.1 dl/g, particularly preferably from 0.02 to 0.08 dl/g. In a case where [η] is at least 0.01 dl/g, the molecular weight of the fluorinated polymer is relatively high, and the layer formed tends to have sufficient strength. On the other hand, when [η] is at most 0.14 dl/g, the molecular weight of the fluorinated polymer is relatively low, and such a fluorinated polymer will have a saturated vapor pressure which imparts practical film deposition rate.

In this specification, the intrinsic viscosity [η] (unit: dl/g) is a value measured by an Ubbelohde viscometer (manufactured by SHIBATA SCIENTIFIC TECHNOLOGY LTD., viscometer Ubbelohde) at a measurement temperature of 30° C. using ASAHIKLIN (registered trademark) AC2000 (manufactured by Asahi Glass Company, Limited) as a solvent.

The upper limit of the refractive index at a wavelength of from 450 to 800 nm of the fluorinated polymer is preferably 1.5, more preferably 1.4. When the refractive index is at most 1.5, the refractive index of the layer such as a charge transport layer obtained by mixing with an organic semiconductor material can be lowered to a level of 1.55 which is at the same level as the refractive index of e.g. the glass substrate, and the light-extraction efficiency will improve. On the other hand, the theoretical lower limit of the refractive index is 1.0.

The refractive index of the organic semiconductor material is usually from about 1.7 to about 1.8. By mixing a fluorinated polymer having a refractive index of at most 1.5 with such a common organic semiconductor material, the refractive index of e.g. the charge transport layer to be obtained can be lowered. When the refractive index of the charge transport layer is lowered and becomes closer to the refractive index of e.g. an electrode or a glass substrate (the refractive indices of soda lime glass and quartz glass are respectively from about 1.51 to about 1.53 and from about 1.46 to about 1.47 in the visible region) adjacent to the charge transport layer, total reflection caused at the interface between the charge transport layer and the electrode or glass substrate can be avoided, and the light-extraction efficiency will improve.

The perfluoropolymer having a fluorinated alicyclic structure in its main chain may, for example, be a perfluoropolymer having units formed by cyclopolymerization of a cyclopolymerizable perfluorodiene, a perfluoropolymer having units formed by polymerization of a perfluoro alicyclic compound having a polymerizable double bond between carbon atoms constituting the alicyclic ring, or a perfluoropolymer having units formed by polymerization of a perfluoro alicyclic compound having a polymerizable double bond between a carbon atom constituting the alicyclic ring and a carbon atom outside the ring.

The cyclopolymerizable perfluorodiene may, for example, be perfluoro(3-butenyl vinyl ether) or perfluoro(allyl vinyl ether). The perfluoro alicyclic compound having a polymerizable double bond between carbon atoms constituting the alicyclic ring may, for example, be perfluoro(2,2-dimethyl-1,3-dioloxe) or perfluoro(4-methoxy-1,3-dioxole). The perfluoro alicyclic compound having a polymerizable double bond between a carbon atom constituting the alicyclic ring and a carbon atom outside the ring may, for example, be perfluoro(4-methyl-2-methylene-1,3-dioxolane).

The perfluoropolymer having a fluorinated alicyclic structure in its main chain may be a homopolymer of the perfluoromonomer, or may be a copolymer obtained by copolymerizing two or more types of the perfluoromonomer. Further, it may be a copolymer of the perfluoromonomer and a perfluoromonomer not forming an alicyclic ring. The perfluoromonomer not forming an alicyclic ring may, for example, be tetrafluoroethylene, hexafluoropropylene or perfluoro(alkoxyethylene), and is preferably tetrafluoroethylene.

The perfluoropolymer having a fluorinated alicyclic structure in its main chain is particularly preferably a homopolymer of perfluoro(3-butenyl vinyl ether).

The fluorinated polymer in the present invention may be a fluorinated polymer other than the perfluoropolymer having a fluorinated alicyclic structure in its main chain, or may be a fluorinated polymer other than the perfluoropolymer.

Such a fluorinated polymer may be polytetrafluoroethylene (PTFE), a tetrafluoroethylene/perfluoro(alkoxyethylene) copolymer (PFA), a tetrafluoroethylene/hexafluoropropylene copolymer (FEP), an ethylene/tetrafluoroethylene copolymer (ETFE), polychlorotrifluoroethylene (PCTFE), polyvinylidene fluoride (PVdF), polyperfluoro(3-butenyl vinyl ether) (manufactured by Asahi Glass Company, Limited, CYTOP (registered trademark)), a tetrafluoroethylene/perfluoro(4-methoxy-1,3-dioxole) copolymer (manufactured by Solvay, Hyflon (registered trademark) AD), a tetrafluoroethylene/perfluoro(2,2-dimethyl-1,3-dioxole) copolymer (manufactured by Chemours (former DuPont), Teflon (registered trademark) AF) or a perfluoro(4-methyl-2-methylene-1,3-dioxolane) polymer. Among them, preferred is a perfluoropolymer having an alicyclic structure in its main chain.

(Semiconductor Material)

The semiconductor material contained in the charge transport layer of the present invention may be an organic semiconductor or may be an inorganic semiconductor, and is preferably an organic semiconductor, the refractive index of which is easily controlled, and which can be easily mixed with the fluorinated polymer.

Only one type or two or more types of semiconductor material may be contained in the charge transport layer of the present invention.

The charge transport layer of the present invention may contain an inorganic compound as a dopant in addition to an organic semiconductor as the chief material, may contain other organic compound (excluding a fluorinated polymer) as a dopant in addition to an organic semiconductor as the chief material, may contain an organic compound (excluding a fluorinated polymer) as a dopant in addition to an inorganic semiconductor as the chief material, or may contain other inorganic semiconductor as a dopant in addition to an inorganic semiconductor as the chief material.

(Inorganic Semiconductor)

The inorganic semiconductor material may, for example, be a metal oxide such as $MoO_3$ or tungsten oxide represented by $WO_x$ (wherein x is an optional positive number). $MoO_3$ is suitable as a hole injection material which transports holes injected from the anode.

(Organic Semiconductor)

The organic semiconductor material is an organic compound material having semiconductive electrical characteristics. Organic semiconductor materials are commonly classified into a hole transport material which transports holes injected from the anode and an electron transport material which transports electrons injected from the cathode, and in the present invention, the hole transport material is used.

As the hole transport material, an aromatic amine derivative is suitably exemplified. As specific examples, the following α-NPD, TAPC, PDA, TPD and m-MTDATA may be mentioned, but the hole transport material is not limited thereto.

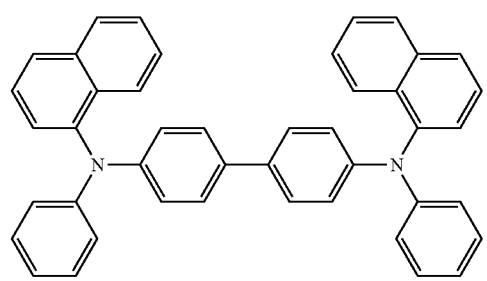

α-NPD

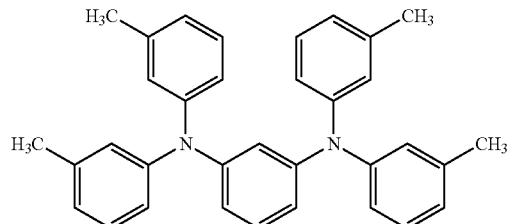

PDA

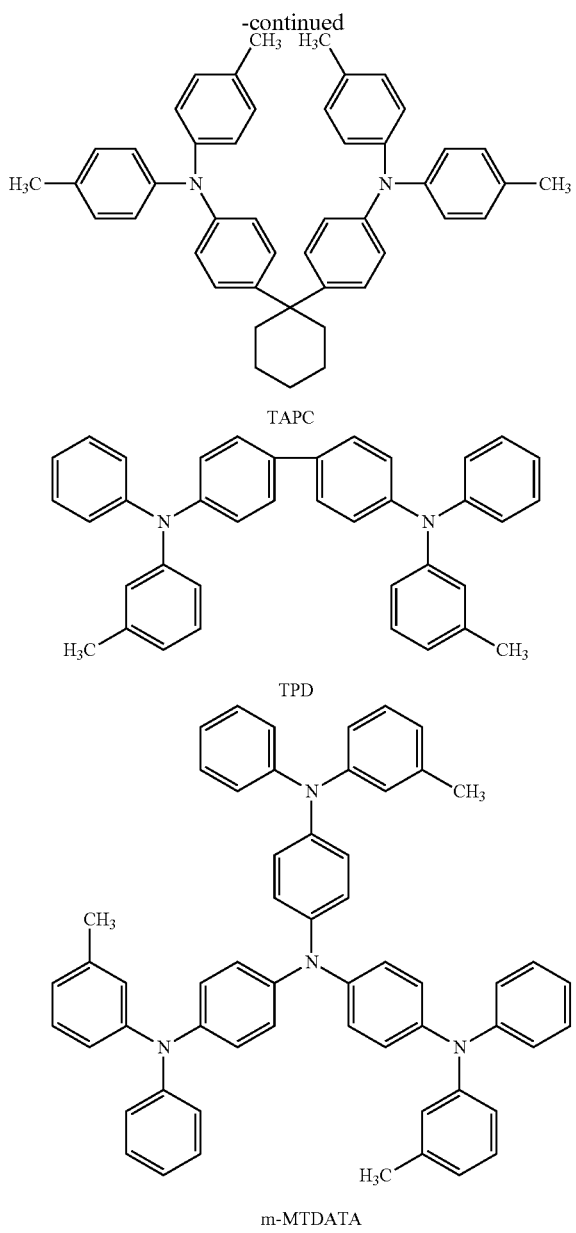

TAPC

TPD m-MTDATA

The charge transport layer of the present invention may contain, in addition to the fluorinated polymer and the semiconductor material, other material, however, it preferably contains only the fluorinated polymer and the semiconductor material. The semiconductor material may be used alone or in combination of two or more. Further, the fluorinated polymer may be used alone or in combination of two or more.

The thickness of the charge transport layer in the present invention is not particularly limited, and is preferably from 10 nm to 250 nm, more preferably from 20 nm to 150 nm.

The charge transport layer of the present invention has an absorption coefficient in a wavelength range of preferably from 450 nm to 800 nm of at most 5,000 $cm^{-1}$, more preferably at most 1,000 $cm^{-1}$, and it particularly preferably has no absorption band in the above wavelength range. If the absorption coefficient exceeds 5,000 $cm^{-1}$, when light passes once through a charge transport layer having a thickness of 100 nm, 5% of light is absorbed based on the total amount of light before passage being 100%. In the interior of an organic photoelectronic element, by multiple interference of light, loss by light absorption when the light passes through the charge transport layer accumulates, and thus light absorption at the time of passage through the charge transport layer may remarkably reduce the light-extraction efficiency. To use a charge transport layer having sufficiently small light absorption is very important so as not to impair the light-emitting efficiency of an organic photoelectronic element. The luminous efficiency of an organic photoelectronic element will not be impaired, whereby the energy utilization efficiency will be high, and further, heat release by light absorption will be suppressed and as a result, the element life will be prolonged.

<Production Method>

As a method for producing the charge transport layer of the present invention, a known dry coating method or wet coating method may be applicable.

The dry coating method may, for example, be a physical deposition method such as resistance heating deposition method, electron beam deposition method or sputtering method. In order that the fluorinated polymer, the organic semiconductor material and the dopant as an optional component forming the charge transport layer are uniformly mixed in an optional proportion and formed into a film, preferred is co-deposition method by which the respective components can be simultaneously deposited.

One of preferred embodiments of the method for producing the charge transport layer of the present invention is a production method comprising a step of co-depositing the fluorinated polymer, the semiconductor material and the dopant as an optional component on an electrode or a charge injection layer.

In the above co-deposition, the total deposition rate of the fluorinated polymer, the semiconductor material and the dopant as an optional component is not particularly limited and may, for example, be from 0.001 to 10 nm/s, whereby a uniform film composition can easily be achieved in an optional mixing ratio.

The content ratio of the respective components contained in the charge transport layer formed can be adjusted by properly adjusting the deposition rates of the respective components.

According to the present embodiment, the respective material components are likely to be uniformly mixed, whereby the above $\Delta E_{th}$ can easily be adjusted to be within the preferred range, and the charge transport layer of the present invention having a sufficiently low refractive index and having a uniform material composition can be produced with high yield.

The wet coating method may, for example, be ink jet method, cast coating method, dip coating method, bar coating method, blade coating method, roll coating method, gravure coating method, flexographic coating method or spray coating method.

By applying a liquid composition forming the charge transport layer on a desired substrate by such a wet coating method, followed by drying and curing, the charge transport layer can be formed.

The liquid composition preferably contains the fluorinated polymer, the semiconductor material and the dopant as an optional component in an optional ratio in a uniformly mixed state. The liquid composition may contain a diluent solvent which can be removed by drying.

One of preferred embodiments of the method for producing the charge transport layer of the present invention is a production method comprising a step of applying a liquid composition containing the fluorinated polymer, the semiconductor material and the dopant as an optional component on an anode or a charge injection layer.

In a case where the liquid composition contains a volatile component such as a diluent solvent, the production method further comprises a step of evaporating the volatile component.

The content ratio of the respective components contained in the charge transport layer formed can be adjusted by properly adjusting the content ratio of the respective components contained in the liquid composition.

According to this embodiment, the respective material components are likely to be uniformly mixed, whereby the above $\Delta E_{th}$ can easily be adjusted to be within the above preferred range, and the charge transport layer of the present invention having a sufficiently low refractive index and having a uniform material composition can be produced with high yield.

The method for producing the charge transport layer of the present invention may be either a dry coating method or a wet coating method, and is preferably a dry coating method, whereby the fluorinated polymer, the semiconductor material and the dopant as an optional component can easily be formed into a film with a uniform mixing ratio.

Accordingly, the charge transport layer of the present invention is preferably a physically deposited layer formed by a physical deposition method.

The charge transport layer of the present invention may be used as an organic photoelectronic device such as an organic electroluminescence element, an organic transistor, a solar cell, an organic photodiode or an organic laser.

The charge transport layer of the present invention is suitable particularly for an organic electroluminescence element (organic EL element). The organic electroluminescence element may be a top emission type or may be a bottom emission type. Such an organic electroluminescence element may be mounted, for example, on an organic EL device such as an organic EL display or an organic EL lighting.

[Organic Photoelectronic Element]

The organic photoelectronic element of the present invention comprises the charge transport layer of the present invention. That is, the organic photoelectronic element of the present invention comprises a charge transport layer comprising a mixed film containing the fluorinated polymer and the semiconductor material, and the mixed film has a material composition such that the above $\Delta E_{th}$ is within the above range.

The layer structure of the organic photoelectronic element of the present invention is not particularly limited, and the organic photoelectronic element of the present invention may have an optional functional layer between the anode and the cathode in addition to the charge transport layer of the present invention and the emissive layer. The material constituting such an optional functional layer is not limited to an organic substance and may be an inorganic substance.

The organic photoelectronic element of the present invention according to one preferred embodiment comprises an anode, an emissive layer and a cathode and at least one of a hole transport layer provided between the anode and the emissive layer and an electron transport layer provided between the cathode and the emissive layer. Further, it has the charge transport layer of the present invention as the hole transport layer.

The organic photoelectronic element of the present invention preferably has a charge injection layer between the electrode and the charge transport layer. That is, it preferably has a hole injection layer between the emissive layer and the hole transport layer and preferably has an electron injection layer between the emissive layer and the electron transport layer.

The organic photoelectronic element of the present invention according to one preferred embodiment is an organic photoelectronic element comprising an anode, a cathode provided to face the anode, an emissive layer provided between the anode and the cathode, a hole injection layer provided on the emissive layer side of the anode, and a hole transport layer provided on the emissive layer side of the hole injection layer, at least the hole transport layer between the hole injection layer and the hole transport layer being the charge transport layer of the present invention.

FIG. 1 illustrates, as a preferred embodiment of the organic photoelectronic element of the present invention, a structure having an anode 1, a hole injection layer 2, a hole transport layer 3, an emissive layer 4, an electron transport layer 5, an electron injection layer 6 and a cathode 7 stacked in this order.

The organic photoelectronic element of the present invention may be a bottom emission type or may be a top emission type.

The hole injection layer is preferably one which has HOMO level between the HOMO level of the hole transport layer and the work function of the anode, and which can lower the hole injection barrier from the anode to the emissive layer. A suitable hole injection layer may be formed by the above-described charge transport layer of the present invention. Otherwise, a hole injection layer of a known organic photoelectronic element may be applied.

In a case where a hole transport layer is provided between the hole injection layer and the emissive layer, such a hole transport layer is preferably one which transports holes to the emissive layer, through which the excitation energy hardly moves from the emissive layer, and which has an energy band gap broader than the emissive layer. A suitable hole transport layer may be formed by the above-described charge transport layer of the present invention. Otherwise, a known hole transport layer may be applied.

As a material of a known hole transport layer, for example, α-NPD, PDA, TAPC, TPD or m-MTDATA may be mentioned, but the material is not limited thereto.

The hole transport layer may contain a material which is also contained in the hole injection layer.

As the emissive layer, a known luminous layer to be used in a known organic photoelectronic element may be applied.

The emissive layer may also have a function as the electron transport layer or electron injection layer.

As the material of the emissive layer, for example, $Alq_3$, Zn-PBO, rubrene, dimethylquinacridone, $DCM_2$, DMQ, a bisstyrylbenzene derivative, Coumarin, DCM, Flrpic, $Ir(ppy)_3$, $(ppy)_2Ir(acac)$, polyphenylenevinylene (PPV), MEH-PPV or PF may be mentioned, but the material is not limited thereto.

The electron injection layer is preferably formed by a material capable of lowering the electron injection barrier from the cathode to the emissive layer.

The electron transport layer is preferably formed by a material which transports electrons to the emissive layer, which is likely to inhibit movement of excitons generated in the emissive layer, and which has a broad energy band gap like the hole transport layer.

As a material of a known electron transport layer, for example, nitrogen-containing heterocyclic ring derivatives such as Alq₃, PBD, TAZ, BND and OXD-7 of the following formulae may be mentioned, but the material is not limited thereto.

The charge transport layer may contain a material also contained in the charge injection layer or the emissive layer.

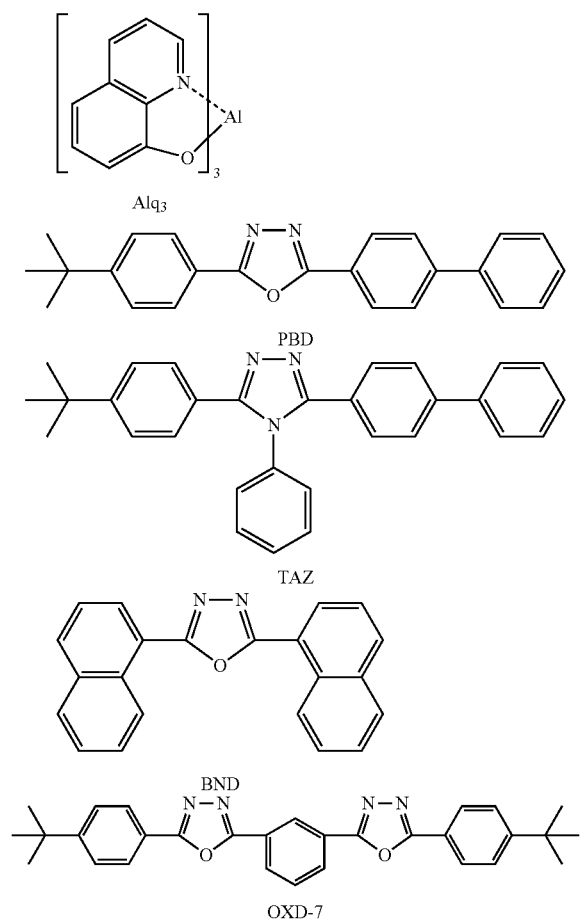

The anode is not particularly limited, and an anode which is used for a known organic photoelectronic element may be applied, such as an indium-tin oxide (ITO) electrode.

The cathode is not particularly limited, and a cathode which is used for a known organic photoelectronic element may be applied, such as a MgAg electrode, a Ag electrode or an Al electrode. The Al electrode may have a buffer layer of e.g. LiF formed on its surface.

The steric structure of the organic photoelectronic element of the present invention is not particularly limited and may, for example, be a steric structure in which the charge injection layer, the charge transport layer and the emissive layer are sandwiched between a pair of electrodes, and a current is made to flow in the thickness direction. As another steric structure, on a charge injection layer having a charge transport layer and an emissive layer stacked thereon, an anode and a cathode are provided on different positions on the surface, and a current is made to flow in the in-plane direction.

The organic photoelectronic element of the present invention according to one preferred embodiment may, for example, be an organic photoelectronic element comprising a reflecting electrode, a counter electrode provided to face the reflecting electrode, an emissive layer provided between the reflecting electrode and the counter electrode, a charge transport layer provided between the reflecting electrode and the emissive layer, and a charge injection layer in contact with the reflecting electrode between the charge transport layer and the reflecting electrode. At least one of the charge transport layer and the charge injection layer is the charge transport layer of the present invention.

The reflecting electrode is an electrode which has a function to reflect light which arrived from the emissive layer toward the counter electrode side.

The reflecting electrode may be either an anode or a cathode and is preferably an anode, whereby the light-extraction efficiency can easily be increased.

As a material of the reflecting electrode, for example, Al or an Al alloy such as AlNd may be mentioned.

A top emission type organic photoelectronic element comprising the above reflecting electrode has, for example, a layer structure comprising in order from the bottom side anode made of an AlNd alloy as the reflecting electrode/hole injection layer/hole transport layer of the present invention/luminous layer/electron transport layer/electron injection layer/cathode made of MgAg as a counter electrode.

The organic photoelectronic element of the present invention according to one preferred embodiment may, for example, be an organic photoelectronic element comprising a transparent electrode, a counter electrode provided to face the transparent electrode, an emissive layer provided between the transparent electrode and the counter electrode, a charge transport layer provided between the transparent electrode and the emissive layer, and a charge injection layer in contact with the transparent electrode between the charge transport layer and the transparent electrode. At least one of the charge transport layer and the charge injection layer is the above-described charge transport layer of the present invention.

The transparent electrode is a transparent electrode through which light which arrived from the emissive layer is transmitted out of the element.

The transparent electrode may be either an anode or a cathode and is preferably an anode, whereby the light-extraction efficiency will easily be increased.

The transparent electrode may, for example, be an ITO-coated glass substrate having a transparent electrically conductive layer of e.g. ITO formed on the surface of a glass substrate.

A bottom emission type organic photoelectronic element comprising the transparent electrode may, for example, be one having a layer structure comprising in order from the bottom side anode comprising an ITO-coated glass substrate/hole injection layer/hole transport layer of the present invention/luminous layer/electron transport layer/electron injection layer/cathode made of MgAg as a counter electrode.

As a method for producing the organic photoelectronic element of the present invention, the above-described method of forming the charge transport layer and in addition, a conventional method may be applied.

<Functional Effect>

The organic photoelectronic element of the present invention comprising the charge transport layer of the present invention shows a high external quantum efficiency (EQE) as compared with an organic photoelectronic element comprising a charge transport layer having a material composition such that the above $\Delta E_{th}$ is out of the above range. The detailed mechanism why EQE improves has not been clearly understood, and as one reason, the following is estimated. With the material composition within such a range, appropriate J-V characteristics are achieved even though the refractive index is low. The J-V characteristics of a HOD are considered to have correlation with both the amount of charge injected from the interface and the conductivity of the entire film, and particularly the threshold electric field $E_{th}$ is considered to be a parameter reflecting easiness of injection of the charge at the interface. In a case where the fluorinated polymer is contained in the charge transport layer, it is estimated that the electronegativity of fluorine assists hole injection (that is, $E_{th}$ is lowered) at the interface on the electrode side, whereas the fluorinated polymer being insulating reduces paths through which the charge is conducted in the layer (that is, the electrical conductivity is lowered). That is, in a system in which the fluorinated polymer is contained as in the present invention, the larger the $\Delta E_{th}$, the more advantageous for injection at the interface and the more the electrical conductivity of the film itself decreases, and accordingly there is a proper range for $\Delta E_{th}$ as in the present invention.

EXAMPLES

Now, the present invention will be described in detail with reference to Examples. However, the present invention is by no means restricted to the following description.

The refractive index, the molecular weight, the intrinsic viscosity and the saturated vapor pressure of each of fluorinated copolymers prepared in Examples were measured in accordance with the following description.

Method for Measuring Refractive Index of Fluorinated Polymer

The refractive index was measured in accordance with JIS K7142.

Method for Measuring Weight Average Molecular Weight of Fluorinated Polymer

The weight average molecular weight of the fluorinated polymer was measured by gel permeation chromatography (GPC). First, a polymethyl methacrylate (PMMA) having a known molecular weight was subjected to measurement by GPC, and a calibration curve was prepared from the elution time at the peak top and the molecular weight. Then, the fluorinated polymer was subjected to measurement, and the molecular weight was obtained from the calibration curve to obtain the weight average molecular weight. As a mobile phase solvent, a mixed solvent of 1,1,1,2,3,4,4,5,5,5-decafluoro-3-methoxy-2-(trifluoromethyl)pentane/hexafluoroisopropyl alcohol (85/15 by volume ratio) was used.

Method for Measuring Intrinsic Viscosity [η] of Fluorinated Polymer

The intrinsic viscosity [η] of the fluorinated polymer was measured by an Ubbelohde viscometer (manufactured by SHIBATA SCIENTIFIC TECHNOLOGY LTD., viscometer Ubbelohde) at a measurement temperature of 30° C. using ASAHIKLIN (registered trademark) AC2000 (manufactured by Asahi Glass Company, Limited) as a solvent.

Method for Measuring Saturated Vapor Pressure of Fluorinated Copolymer

The saturated vapor pressure at 300° C. was measured by using vacuum thermovalance VAP-9000 manufactured by ADVANCE RIKO, Inc. (former ULVAC-RIKO, Inc.).

The charge transport layer and the organic EL element prepared as described below were evaluated in accordance with the following method.

Method for Measuring Refractive Index of Charge Transport Layer

Using a variable angle spectroscopic ellipsometer (manufactured by J. A. Woollam Co., Inc., M-2000U), measurement was conducted on a film on a silicon substrate while the angle of incidence of light was changed every 5° within a range of from 45 to 75°. At each angle, ψ and Δ which are ellipsometry parameters were measured at intervals of about 1.6 nm within a wavelength range of from 450 to 800 nm. Using the above measurement data, the dielectric function of an organic semiconductor was subjected to fitting analysis by Cauchy model, and the refractive index and the extinction coefficient of the charge transport layer to light at each wavelength were obtained.

<Fluorinated Polymer>

Fluorinated polymers A and B were obtained by the following method.

30 g of perfluoro(3-butenyl vinyl ether), 30 g of 1,1,1,2,2,3,3,4,4,5,5,6,6-tridecafluorohexane, 0.5 g of methanol and 0.44 g of diisopropyl peroxydicarbonate as a polymerization initiator were put in a glass reactor having an internal capacity of 50 ml. The system in the reactor was replaced with high purity nitrogen gas, and polymerization was carried out at 40° C. for 24 hours. The obtained solution was subjected to desolvation under 666 Pa (absolute pressure) at 50° C. to obtain 28 g of fluorinated polymer A. The intrinsic viscosity [η] was 0.04 dl/g.

The unstable terminal group of the obtained fluorinated polymer A was substituted by a —$CF_3$ group with fluorine gas by the method disclosed in JP-A-H11-152310, paragraph [0040] to obtain fluorinated polymer B. Of the obtained fluorinated polymer B, the intrinsic viscosity [η] was 0.04 dl/g, Mw was 9,000, Mn was 6,000, and the dispersity (Mw/Mn) was 1.50. The fluorine atom content ($R_{F-P}$) of the fluorinated polymer B was about 68 mass %.

As PFA, commercial products such as Fluon PFA (manufactured by Asahi Glass Company, Limited) may be used. The fluorine atom content ($R_{F-P}$) of PFA used was about 76 mass %.

As ETFE, commercial products such as Fluon ETFE (manufactured by Asahi Glass Company, Limited) may be used. The fluorine atom content ($R_{F-P}$) of ETFE used was about 59 mass %.

<Organic Semiconductor Material>

As α-NPD, a commercial product was used. For example, α-NPD is available from Sigma-Aldrich.

<Inorganic Material>

As $MoO_3$, a commercial product was used. For example, $MoO_3$ is available from Sigma-Aldrich.

[Preparation of HOD]

As a substrate to prepare a HOD, a glass substrate having an ITO (indium-tin oxide) film having a thickness of 100 nm formed in a 2 mm width strip was used. The substrate was subjected to ultrasonic cleaning with a neutral detergent, acetone and isopropanol and further cleaned by boiling in isopropanol, and substances attached to the surface of the ITO film were removed by ozone treatment. The substrate was placed in a vacuum deposition apparatus, and the apparatus was evacuated of air to a pressure of at most $10^{-4}$ Pa, and films were formed as follows.

First, molybdenum trioxide was subjected to resistant heating in the vacuum deposition apparatus to form, as a hole injection layer, a $MoO_3$ film having a thickness of 5 nm at a deposition rate of 0.1 nm/s on the ITO film surface on the substrate. Then, the fluorinated polymer as identified in Table 1 and the organic semiconductor material α-NPD were co-deposited in a proportion such that the fluorination rate ($R_{F\text{-}mix}$) was as identified in Table 1 by resistant heating in the vacuum deposition apparatus to form a measurement film having a thickness of 100 nm. The total deposition rate of the materials was 0.2 nm/s. Finally, Al (aluminum) was deposited on the measurement film by resistant heating in the vacuum deposition apparatus to form an Al film having a thickness of 100 nm in a 2 mm width strip to obtain a HOD. The element area is 2 mm×2 mm at which the 2 mm width ITO film and the 2 mm width Al film intersect with each other.

The layer structure of the prepared HOD was such that glass substrate/ITO electrode (100 nm thickness)/MoO$_3$ (5 nm thickness)/measurement film (100 nm thickness)/Al electrode (100 nm thickness).

[Evaluation of J-V Characteristics of HOD]

By source meter (manufactured by Keithley, Keithley (registered trademark) 2401), the current flowing in the HOD at each voltage was measured while a voltage was applied, taking the ITO electrode as the anode and the aluminum electrode as the cathode.

Figure 2:
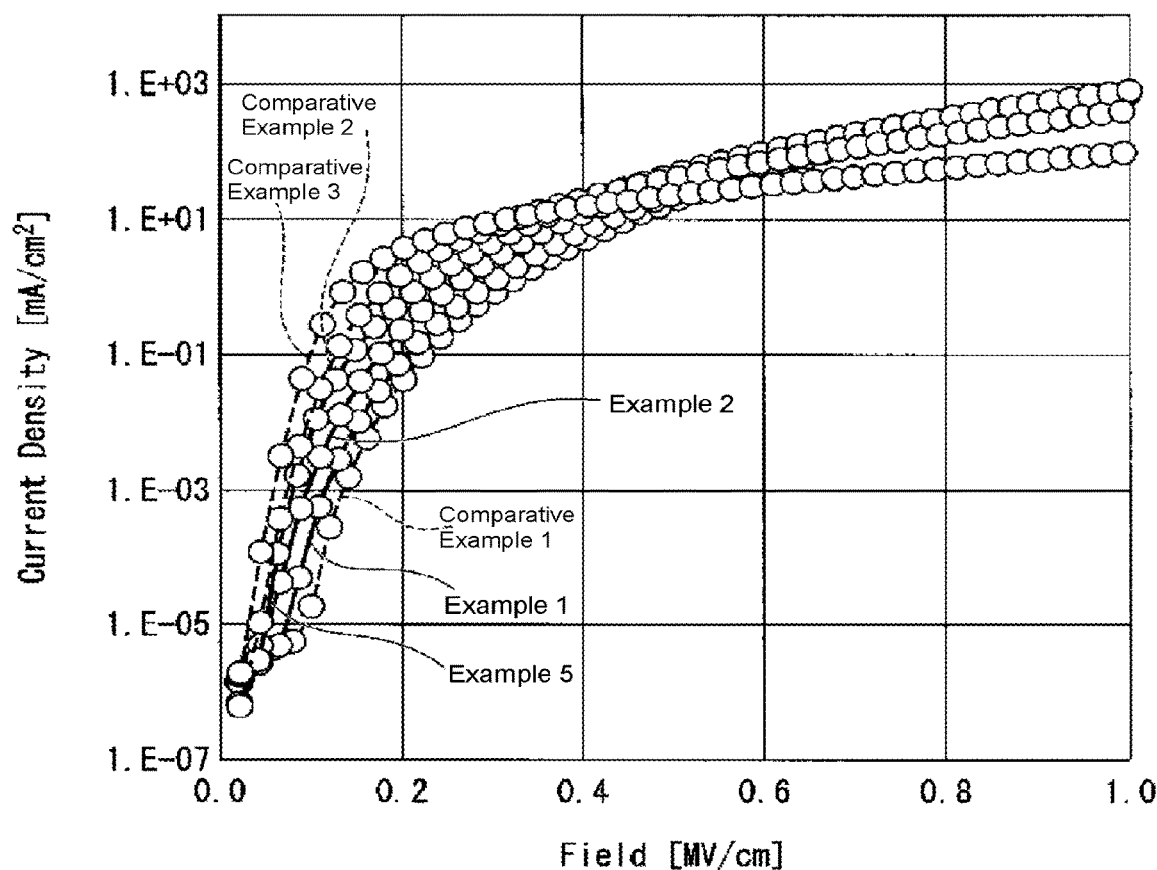
FIG. 2 is a graph illustrating J (current)/V (voltage) characteristics of a HOD prepared.

Based on the measurement results, a graph illustrating the J-V characteristics is shown in FIG. 2. In this graph, "E" in the vertical axis represents the power. For example, "1.E-01" represents "$1.0 \times 10^{-1}$". The threshold electric field ($E_{th}$) of the HOD was obtained from the graph, and $\Delta E_{th}$ was calculated, and the results are shown in Table 1. A graph illustrating the J-V characteristics in Examples 3 and 4 is omitted and is not shown.

[Preparation of Organic EL Element (B)]

As a substrate, a glass substrate having an ITO (indium tin oxide) film formed in a 2 mm width strip was obtained. The substrate was subjected to ultrasonic cleaning with a neutral detergent, acetone and isopropanol, and further cleaned by boiling in isopropanol, and substances attached to the ITO film surface were removed by ozone treatment. The substrate was placed in a vacuum deposition apparatus, and the vacuum deposition apparatus was evacuated of air to a pressure of at most $10^{-4}$ Pa, and molybdenum trioxide was subjected to resistance heating in the vacuum deposition apparatus to form, as a hole injection layer, a film having a thickness of 5 nm on the substrate at a deposition rate of 0.1 nm/s. Then, the fluorinated polymer as identified in Table 1 and the organic semiconductor material α-NPD were co-deposited in a proportion such that the fluorination rate ($R_{F\text{-}mix}$) was as identified in Table 1 by resistant heating in the vacuum deposition apparatus to form a hole transport layer comprising a mixed film having a thickness of 60 nm. The total deposition rate of the two materials was 0.2 nm/s. Then, the luminous material Ir(ppy)$_2$(acac) and the host material CBP were co-deposited in a mass ratio of Ir(ppy)$_2$(acac) to CBP of 8:92 by resistant heating in the vacuum deposition apparatus to form an emissive layer having a thickness of 15 nm. Then, the organic semiconductor TPBi was subjected to resistant heating in the vacuum deposition apparatus to form a film of 60 nm at 0.2 nm/s as an electron transport layer. Then, lithium fluoride was subjected to resistant heating in the vacuum deposition apparatus to form a film of 1 nm at 0.01 nm/s as an electron injection layer. Finally, Al (aluminum) was deposited by resistant heating in a 2 mm width strip to obtain an organic EL element (B).

The layer structure of the prepared organic EL element (B) was such that ITO/MoO$_3$ (5 nm)/hole transport layer (60 nm) comprising mixed film/8 wt %-Ir(ppy)$_2$(acac): CBP (15 nm)/TPBi (60 nm)/LiF (1 nm)/Al.

[Preparation of Organic EL Element (A)]

In the same manner as the preparation of the organic EL element (B), a substrate provided with a clean ITO film on the surface was prepared. This substrate was placed in a vacuum deposition apparatus, and the vacuum deposition apparatus was evacuated of air to a pressure of at most $10^{-4}$ Pa. Then, molybdenum trioxide was subjected to resistant heating in the vacuum deposition apparatus to form a film of 5 nm at a deposition rate of 0.1 nm/s on the substrate as a hole injection layer. Then, the organic semiconductor material α-NPD was subjected to resistant heating in the vacuum deposition apparatus to form a hole transport layer having a thickness of 45 nm. The deposition rate was 0.2 nm/s. Then, in the same manner as the preparation of the organic EL element (B), an emissive layer, an electron transport layer, an electron injection layer and an aluminum layer were stacked in this order to obtain an organic EL element (A).

The layer structure of the prepared organic EL element (A) was such that ITO/MoO$_3$ (5 nm)/hole transport layer (45 nm)/8 wt %-Ir(ppy)$_2$(acac): CBP (15 nm)/TPBi (65 nm)/LiF (1 nm)/Al.

[Evaluation of External Quantum Efficiency (EQE) of Organic EL Element]

From results of measurement of J (current density)-V (voltage)-L (luminance) characteristics using source meter (manufactured by Keithley, Keithley (registered trademark) 2401) and a luminance meter (CS-200 manufactured by KONICA MINOLTA INC.) and results of measurement of emission angle distribution using a mini-spectrometer (C10083CA manufactured by Hamamatsu Photonics K.K.) and a rotating stage, the external quantum efficiency of each organic EL element prepared was measured, and whether EQE improved or decreased was evaluated based on the after-described organic EL of Comparative Example 1. The results are shown in Table 1.

Examples 1 to 5 and Comparative Examples 1 to 3

Using the fluorinated polymer and the semiconductor material as identified in Table 1, a HOD and an organic EL were prepared and evaluated by the above method. In Comparative Example 1, the fluorinated polymer was not used, and only the semiconductor material was used. That is, EQE in each of Examples 1 to 5 and Comparative Examples 2 and 3 was measured by using the organic EL element (B). Further, EQE in Comparative Example 1 was measured by using the organic EL element (A).

Figure 3:
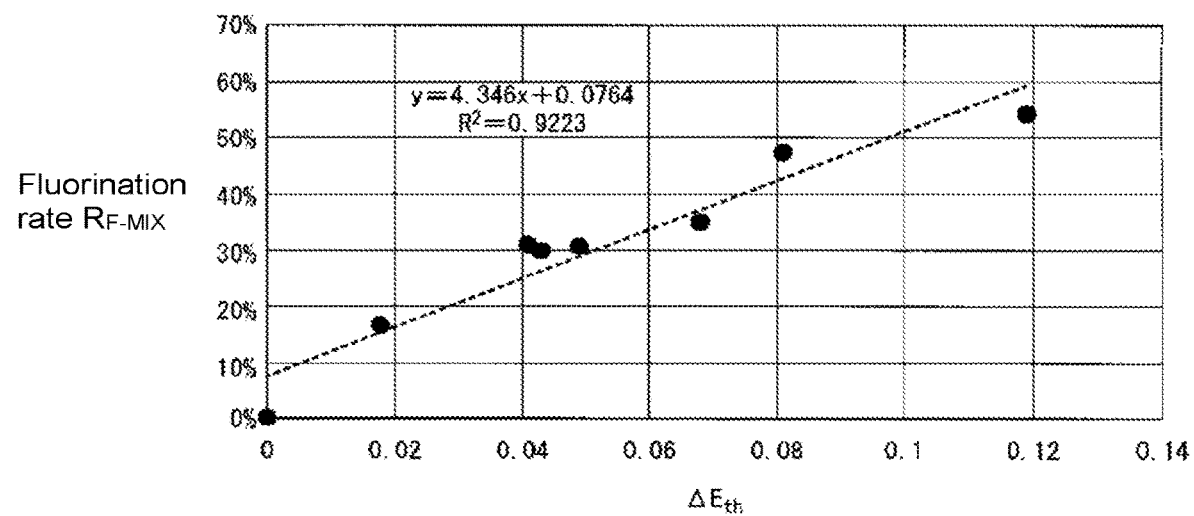
FIG. 3 is a plot illustrating the correlation between $\Delta E_{th}$ and the fluorination rate ($R_{F\text{-}mix}$) of a charge transport layer in an organic photoelectronic element prepared.

As shown in Table 1, EQE improved with respect to the organic photoelectronic elements in Examples 1 to 5 comprising a hole transport layer having a material composition such that $\Delta E_{th}$ is within a range of from 0.010 to 0.080 MV/cm. The correlation between $\Delta E_{th}$ and the fluorination rate ($R_{F\text{-}mix}$) of the charge transport layer in each organic photoelectronic element is shown in FIG. 3.

In Table 1, "n@600 nm" means the refractive index at a wavelength of 600 nm of the charge transport layer containing the fluorinated polymer and the semiconductor material in the organic photoelectronic element in each Example.

"$E_{th}$" in Comparative Example 1 in Table 1 corresponds to "$E_{th}(A)$" ($E_{th}$ of the film containing only α-NPD), and "$E_{th}$" in Examples 1 to 5 and Comparative Examples 2 and 3 corresponds to "$E_{th}(B)$" ($E_{th}$ of the mixed film).

TABLE 1

| | Fluorinated polymer | Semiconductor material | $E_{th}$ | $\Delta E_{th}$ | $R_P$ | $R_{F\text{-}mix}$ | n@600 nm | EQE |
|---|---|---|---|---|---|---|---|---|
| Example 1 | Fluorinated polymer B | α-NPD | 0.17 | 0.018 | 24% | 16% | 1.67 | Improved |
| Example 2 | Fluorinated polymer B | α-NPD | 0.147 | 0.041 | 45% | 31% | 1.59 | Improved |
| Example 3 | ETFE | α-NPD | 0.145 | 0.043 | 50% | 30% | 1.59 | Improved |
| Example 4 | PFA | α-NPD | 0.139 | 0.049 | 40% | 30% | 1.58 | Improved |
| Example 5 | Fluorinated polymer B | α-NPD | 0.12 | 0.068 | 51% | 35% | 1.56 | Improved |
| Comparative Example 1 | — | α-NPD | 0.188 | 0 | 0% | 0% | 1.79 | Standard |
| Comparative Example 2 | Fluorinated polymer B | α-NPD | 0.107 | 0.081 | 69% | 47% | 1.48 | Decreased |
| Comparative Example 3 | Fluorinated polymer B | α-NPD | 0.069 | 0.119 | 79% | 54% | 1.44 | Decreased |

From the above results, the charge transport layer in Examples of the present invention was confirmed to improve the external quantum efficiency of an organic photoelectronic element while maintaining the basic performance.

INDUSTRIAL APPLICABILITY

The charge transport layer of the present invention and the element comprising it are suitably used for an operation panel and an information display panel of electronic apparatus and is suitably used also for an organic photoelectronic device.

This application is a continuation of PCT Application No. PCT/JP2017/044772, filed on Dec. 13, 2017, which is based upon and claims the benefit of priority from Japanese Patent Application No. No. 2016-242466 filed on Dec. 14, 2016 and Japanese Patent Application No. 2017-161644 filed on Aug. 24, 2017. The contents of those applications are incorporated herein by reference in their entireties.

REFERENCE SYMBOLS

1: Anode, 2: hole injection layer, 3: hole transport layer, 4: emissive layer, 5: electron transport layer, 6: electron injection layer, 7: cathode, 10: organic photoelectronic element

What is claimed is:

1. A charge transport layer comprising a film containing a fluorinated polymer and a semiconductor material,
wherein the film has a material composition such that $\Delta E_{th}$ is within a range of from 0.010 to 0.080 MV/cm,
wherein $\Delta E_{th}$ is a value calculated from the formula ($\Delta E_{th} = E_{th}(A) - E_{th}(B)$),
$E_{th}(A)$ is a threshold electric filed when a measurement film is formed only by the semiconductor material in the following HOD;
$E_{th}(B)$ is a threshold electric filed when a measurement film is formed only by the film in the following HOD;
the threshold electric filed is a value of an electric field when a current flows at a current density of 0.0001 time a current density Js (unit: mA/cm²) at which a current flows when an electric field of 0.8 MV/cm is applied to between an ITO electrode and an Al electrode as a standard, in the following HOD; and
HOD is a hole only device comprising only the following layer structure: glass substrate/ITO electrode (100 nm thickness)/MoO₃ (5 nm thickness)/measurement film (100 nm thickness)/Al electrode (100 nm thickness).

2. The charge transport layer according to claim 1, wherein the film has a fluorination rate ($R_{F\text{-}mix}$) of from 5 to 45%,
wherein the fluorination rate ($R_{F\text{-}mix}$) is a product represented by the formula ($R_{F\text{-}mix} = R_{F\text{-}P} \times R_P$),
$R_{F\text{-}P}$ in the formula is a fluorine atom content (mass %) of the fluorinated polymer contained in the film, and
$R_P$ in the formula is a fluorinated polymer content (vol %) in the film.

3. The charge transport layer according to claim 2, wherein the fluorinated polymer has a fluorine atom content ($R_{F\text{-}P}$) of from 20 to 77 mass %.

4. The charge transport layer according to claim 2, wherein the film has a fluorinated polymer content ($R_P$) of from 20 to 65 vol %.

5. The charge transport layer according to claim 1, wherein the fluorinated polymer has a refractive index in a wavelength range of from 450 to 800 nm of at most 1.5.

6. The charge transport layer according to claim 1, wherein the fluorinated polymer is a perfluoropolymer.

7. The charge transport layer according to claim 6, wherein the perfluoropolymer is a perfluoropolymer having units formed by cyclopolymerization of a cyclopolymerizable perfluorodiene.

8. The charge transport layer according to claim 7, wherein the perfluorodiene is perfluoro(3-butenyl vinyl ether).

9. An organic photoelectronic element comprising the charge transport layer as defined in claim 1.

10. The organic photoelectronic element according to claim 9, wherein the photoelectronic element is an organic EL element.

11. The organic photoelectronic element according to claim 10, wherein the organic EL element comprises an anode, a cathode provided to face the anode, an emissive layer provided between the anode and the cathode, and the charge transport layer provided on the emissive layer side of the anode.

12. The organic photoelectronic element according to claim 10, wherein the organic EL element comprises an anode, a cathode provided to face the anode, an emissive layer provided between the anode and the cathode, a hole injection layer provided on the emissive layer side of the anode, and a hole transport layer provided on the emissive layer side of the hole injection layer, and at least one of the hole injection layer and the hole transport layer is the charge transport layer.

* * * * *